United States Patent
Kameyama et al.

(10) Patent No.: US 11,762,034 B2
(45) Date of Patent: *Sep. 19, 2023

(54) ABNORMAL POWER SUPPLY VOLTAGE DETECTION DEVICE AND METHOD FOR DETECTING ABNORMAL POWER SUPPLY VOLTAGE

(71) Applicant: RENESAS ELECTRONICS CORPORATION, Tokyo (JP)

(72) Inventors: Tadashi Kameyama, Tokyo (JP); Masanori Ikeda, Tokyo (JP); Masataka Minami, Tokyo (JP); Kenichi Shimada, Tokyo (JP); Yukitoshi Tsuboi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/559,091

(22) Filed: Dec. 22, 2021

(65) Prior Publication Data
US 2022/0113357 A1    Apr. 14, 2022

Related U.S. Application Data

(63) Continuation of application No. 16/855,814, filed on Apr. 22, 2020, now Pat. No. 11,243,264.

(51) Int. Cl.
*G01R 31/40* (2020.01)
(52) U.S. Cl.
CPC .................... *G01R 31/40* (2013.01)

(58) Field of Classification Search
CPC ..... G01R 31/40; G01R 19/16552; G01R 19/00
(Continued)

(56) References Cited

U.S. PATENT DOCUMENTS 5,973,551 A    10/1999 Mitsuda
10,558,258 B2 *  2/2020 Tan .................. G06F 13/362
(Continued)

FOREIGN PATENT DOCUMENTS

JP          3219019 B2    10/2001
JP       2008-151519 A     7/2008

OTHER PUBLICATIONS

U.S. PTO Non-Final Office Action issued in related parent U.S. Appl. No. 16/855,814, dated Jun. 24, 2021.
(Continued)

*Primary Examiner* — Giovanni Astacio-Oquendo
(74) *Attorney, Agent, or Firm* — McDermott Will & Emery LLP

(57) ABSTRACT

The abnormal power supply voltage detection device has a function of accurately detecting the abnormal voltage in accordance with the characteristics of the semiconductor element for each semiconductor chip. Circuit group for operating the adjustment function has a function of preventing the influence of the power supply voltage of the logic system such as control in the semiconductor product malfunctions becomes abnormal. Furthermore, it has a function of detecting the abnormal voltage of the various power supplies in the semiconductor product. It also has a function to test the abnormal voltage detection function in the normal power supply voltage range during use of semiconductor products.

9 Claims, 13 Drawing Sheets

(58) Field of Classification Search
USPC .................................. 324/764.01, 537, 500
See application file for complete search history.

(56) References Cited

U.S. PATENT DOCUMENTS

| | | | |
|---|---|---|---|
| 10,890,605 B1* | 1/2021 | Chun | G01R 19/16552 |
| 11,422,201 B1* | 8/2022 | Raschbacher | G01R 19/16552 |
| 2008/0043384 A1 | 2/2008 | Chu | |
| 2008/0094027 A1* | 4/2008 | Cho | H02J 7/00 |
| | | | 320/108 |
| 2013/0002029 A1 | 1/2013 | Rodenhiser et al. | |
| 2014/0043007 A1 | 2/2014 | Wei et al. | |
| 2015/0109020 A1 | 4/2015 | Morino | |
| 2016/0061874 A1 | 3/2016 | Nakai | |
| 2020/0025834 A1* | 1/2020 | Okamoto | G06F 1/30 |
| 2021/0190858 A1* | 6/2021 | Sato | H03K 17/18 |

OTHER PUBLICATIONS

U.S. PTO Notice of Allowance issued in related parent U.S. Appl. No. 16/855,814, dated Oct. 20, 2021.
Entire U.S. PTO Image File Wrapper (IFW) associated with related parent U.S. Appl. No. 16/855,814, filed Apr. 22, 2020.

* cited by examiner

FIG. 3

| DIGITAL POWER SUPPLY STATE | INITIAL STATE | OPERATION NORMAL DIGITAL POWER SUPPLY | OPERATION OVER_HI DIGITAL POWER SUPPY | OPERATION UNDER_LOW DIGITAL POWER SUPPLY | OPERATION ILLEGAL STATE |
|---|---|---|---|---|---|
| ANALOG POWER SUPPLY | GND | NORMAL SPEC. | NORMAL SPEC. | NORMAL SPEC. | NORMAL SPEC. |
| DIGITAL POWER SUPPLY | GND | NORMAL SPEC. | OVER_HI SPEC. | UNDER_LOW SPEC | UNSPECIFIED ERROR |
| Vm_H | GND | LOW (INPUT) | LOW(OUTPUT) | HIGH (OUTPUT) | HIGH (OUTPUT) |
| Vm_L | GND | LOW(INPUT) | LOW(OUTPUT) | LOW(OUTPUT) | LOW(OUTPUT) |
| Vm_set Ou1 | LOW | HIGH | HIGH | HIGH | HIGH |
| Vm_set Over | LOW | HIGH | HIGH | LOW | HIGH |
| Vm_set Under | LOW | LOW | LOW | HIGH | HIGH |

FIG. 6
(A) POWER SUPPLY VOLTAGE TRANSITION
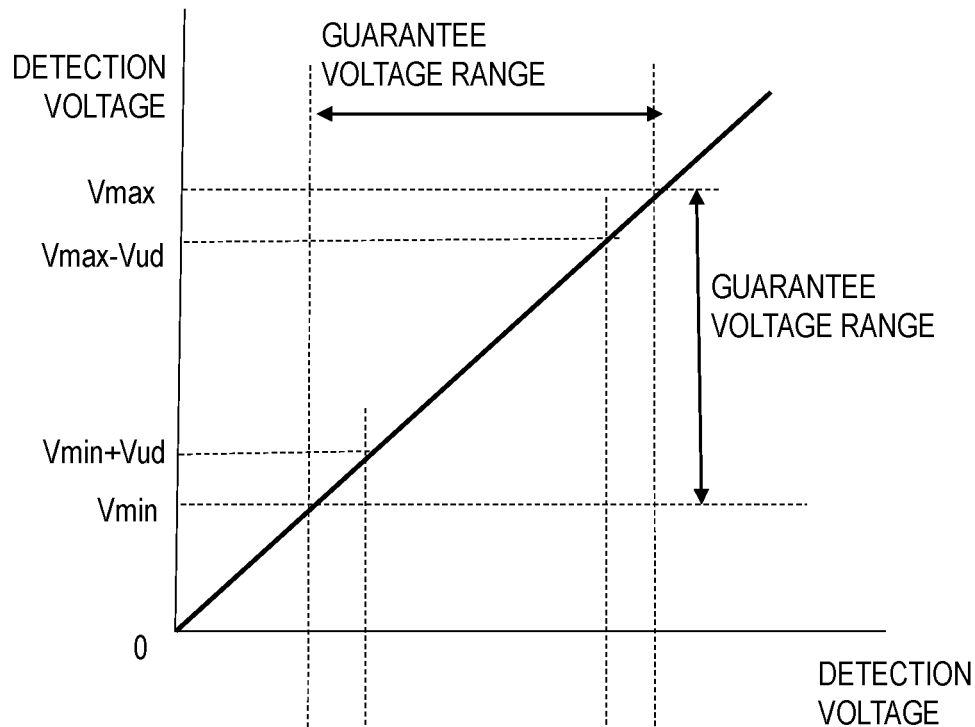
(B) EACH NODE WAVEFORM
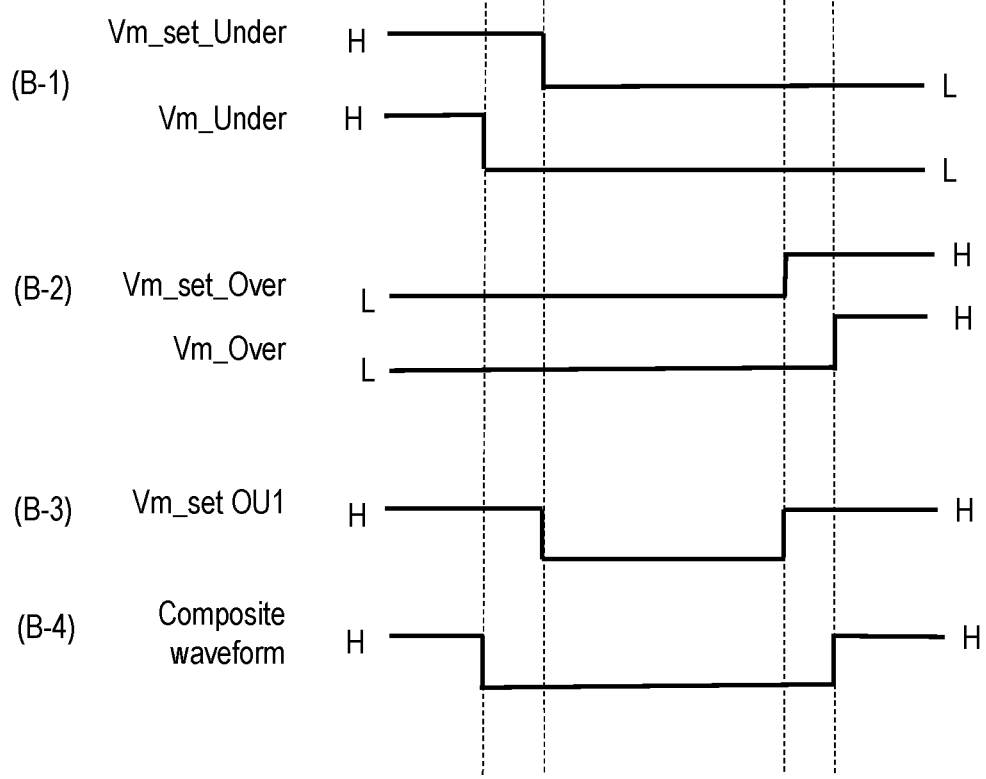

ABNORMAL POWER SUPPLY VOLTAGE DETECTION DEVICE AND METHOD FOR DETECTING ABNORMAL POWER SUPPLY VOLTAGE

CROSS-REFERENCE TO RELATED APPLICATIONS

This is a Continuation of U.S. patent application Ser. No. 16/855,814, filed Apr. 22, 2020, including the specification, drawings and abstract are incorporated herein by reference in its entirety.

BACKGROUND

The present invention relates to an abnormal power supply voltage detection device and a method for detecting the abnormal power supply voltage.

Functional safety of abnormal power supply voltage detection in semiconductor products, when the voltage of the plurality of power supplies used in a plurality of areas (functional blocks) in the semiconductor product is outside the operation guarantee voltage range, by detecting the power supply individually, functional safety measures can be performed. If the power supply voltage required for the operation of these circuits is abnormal, including circuits for functional safety applications (Safety Mechanism) in addition to normal operating circuits in semiconductor products, the operation (functions and performance) of the circuits cannot be guaranteed. Therefore, the abnormal power supply voltage in semiconductor products is indispensable and is one of the most critical requirements among functional safety applications (Safety Mechanism) to be implemented in semiconductor products.

There are disclosed techniques listed below.
[Patent Document 1] Japanese Unexamined Patent Application Publication No. 2008-151519
[Patent Document 2] Japanese Patent No. 3219019

Patent Document 1 discloses an abnormality detecting circuit for monitoring a change in the signal voltage in a range in which the operation is determined to be normal.

Patent Document 2 discloses the abnormal current detecting circuit for detecting an abnormal current by generating a reference value in the circuit by comparator circuit of the voltage, and comparing the differences.

SUMMARY

Abnormal detection circuit of Patent Document 1, using two identical types of detection circuits, voltage detection, current detection, is intended to perform temperature detection, the explanation and the method of discrimination of the difference between the case where the detected value is normal and abnormal, the specific details (function and performance) is not shown, the definition of abnormality. It does not disclose the specific contents about that it has a function and performance capable of detecting abnormality in the requirements according to this definition. In addition, the abnormal current detection circuit of Patent Document 2 is presumed to be a current control type circuit for the load drive circuit, but the specific content is not disclosed as to the fact that in the operating state of the load drive circuit, the comparator circuit has requirements and performance capable of detecting the abnormality.

An abnormal power supply voltage detection device according to an embodiment has a function of accurately detecting the abnormal voltage in accordance with the characteristics of the semiconductor element for each semiconductor chip. Circuit group for operating the adjustment function has a function of preventing the influence of the power supply voltage of the logic system such as control in the semiconductor product malfunctions becomes abnormal. Furthermore, it has a function of detecting the abnormal voltage of the various power supplies in the semiconductor product. It also has a function to test the abnormal voltage detection function in the normal power supply voltage range during use of semiconductor products.

Including a power supply used in the logic system circuit such as the control of the semiconductor product, and accurately detects the abnormal voltage exceeding the operation guaranteed voltage range of the various power supplies in the semiconductor product, it is possible to control by outputting the abnormality to the semiconductor product outside by providing a terminal for controlling the inside of the semiconductor product. In particular, since the abnormal power supply voltage used in the operation of the logic system such as the control of the semiconductor product cannot be information processed inside the semiconductor product, the semiconductor product external and outputs the abnormality to control. At this time, the circuit group for detecting the abnormal power supply voltage, it is essential not affected by malfunction of the logic system such as control. In other words, it becomes possible to avoid dependent failures in functional safety. In addition, this abnormal voltage detection function enables field tests such as fault detection during use.

BRIEF DESCRIPTION OF THE DRAWINGS

FIG. 3 is a correspondence table of the power supply voltage state and the output signal.

FIG. 6 is a diagram for explaining the abnormal power supply voltage detection of FIGS. 4 and 5.

DETAILED DESCRIPTION

Figure 1:
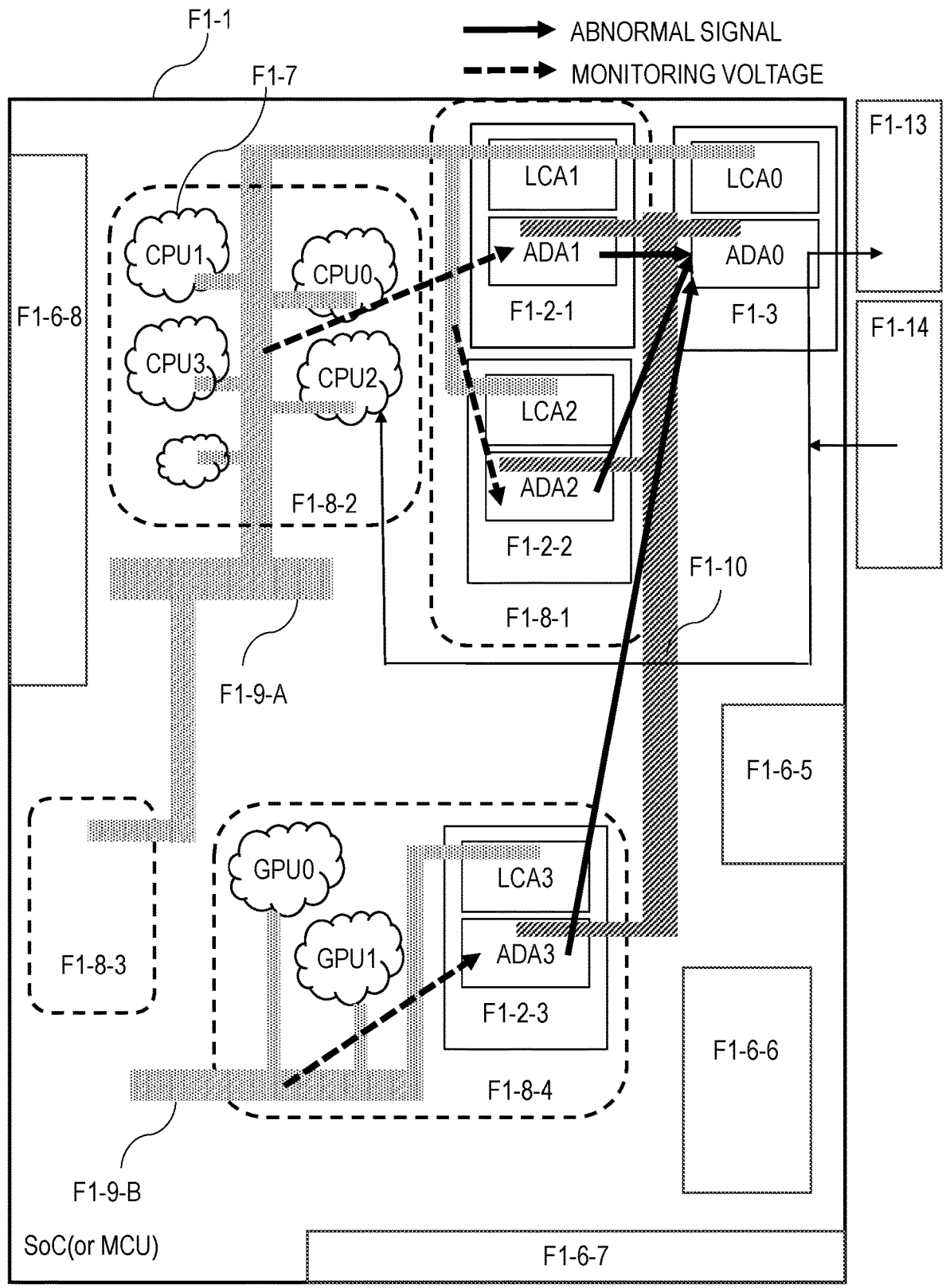
FIG. 1 is a block diagram of a SoC of the abnormal power supply voltage detection device according to the first embodiment.

Hereinafter, a semiconductor device according to an embodiment will be described in detail by referring to the drawings. In the specification and the drawings, the same or corresponding elements are denoted by the same reference numerals, and a repetitive description thereof is omitted. In the drawings, for convenience of description, the configuration may be omitted or simplified. Also, at least some of the embodiments and each modified example may be arbitrarily combined with each other.

First Embodiment

FIG. 1 is a block diagram of a SoC (System on Chip) of the abnormal power supply voltage detecting device according to the first embodiment. Incidentally, SoC may be MCU (Micro Control Unit).

As shown in FIG. 1, the SoC (F1-1) has a CIVFD (chip internal voltage fault detection: Chip Internal Voltage Failure Detection)(F1-2-1 to 3), a CIVFD output (F1-3), a core voltage area (F10), an analog voltage area (F1-5), a digital or analog exclusive voltage area (F1-6-5 to 8), a power supply separation area (F1-7), a functional circuit area (F1-8-1 to 4), a core voltage power supply line (F1-9-A, B), and an analog voltage power supply line (F1-10). CIVFD output (F1-3) is connected to an external module (F1-13) with AD conversion function and an external module controller (F1-14). Further, CIVFD, digital or analog exclusive voltage area, the power supply isolation area, the functional circuit area can each be mounted any number.

As examples of the power supply separation area (F1-7), a plurality of CPUs (Central Processing Unit) in the functional circuit area (F1-8-2), a plurality of GPUs (Graphic Processing Unit) are arranged in the functional circuit area (F1-8-4). The status (normal/abnormal) of the power supply voltage used in the functional circuit area (F1-8-1 to 4) is monitored in the analog detection area within CIVFD (F1-2-1 to 3) and output to the external module (F1-13) via the analog output area (ADA0) of CIVFD output (F1-3). The logic control area (LCA1, LCA2, LCA3) within CIVFD (F1-2-1 to 3) performs setting, control, and data processing of analog functions and characteristics of the analog detection area (ADA1, ADA2, ADA3) within CIVFD (F1-2-1 to 3).

In FIG. 1, three CIVFD (F1-2-1 to 3) are arranged to monitor the core power supply voltages in four areas of the functional circuit area (F1-8-1 to 4), determine whether the core power supply voltages in these areas are normal voltages within the operation guarantee range or abnormal voltages outside the operation guarantee range within each CIVFD (F1-2-1 to 3), transmit the results to CIVFD output (F1-3), and transmit from CIVFD output (F1-3) to the CPU of the external module (F1-13) with the AD conversion function or, depending on the type of power supply, to the CPU of the power supply isolation area (F1-7) in the SoC (F1-1).

In addition, the SoC (F1-1) is connected to the external module (F1-14) and is used to set the analog output layer in the logic control area of CIVFD output (F1-3), or to detect the failure of the signal path and the signal path of the CPU from the analog output area of CIVFD output (F1-3) to the external module (F1-13) with the AD conversion function.

The results monitored by CIVFD (F1-2-1-3) are conveyed by two independent signals to CIVFD outputs (F1-3). For example, when the two signals are (H, H) (H: High), the voltage within the operation guarantee voltage (normal), (H, L) (L: Low) is an abnormal voltage lower than the operation guarantee lower limit value, in the case of (L, H) is an abnormal voltage higher than the operation guarantee upper limit value, in the case of (L, L) is stopped SoC (F1-1) or CIVFD (F1-2) and CIVFD output (F1-3) is supposed to indicate the state, respectively.

Figure 2:
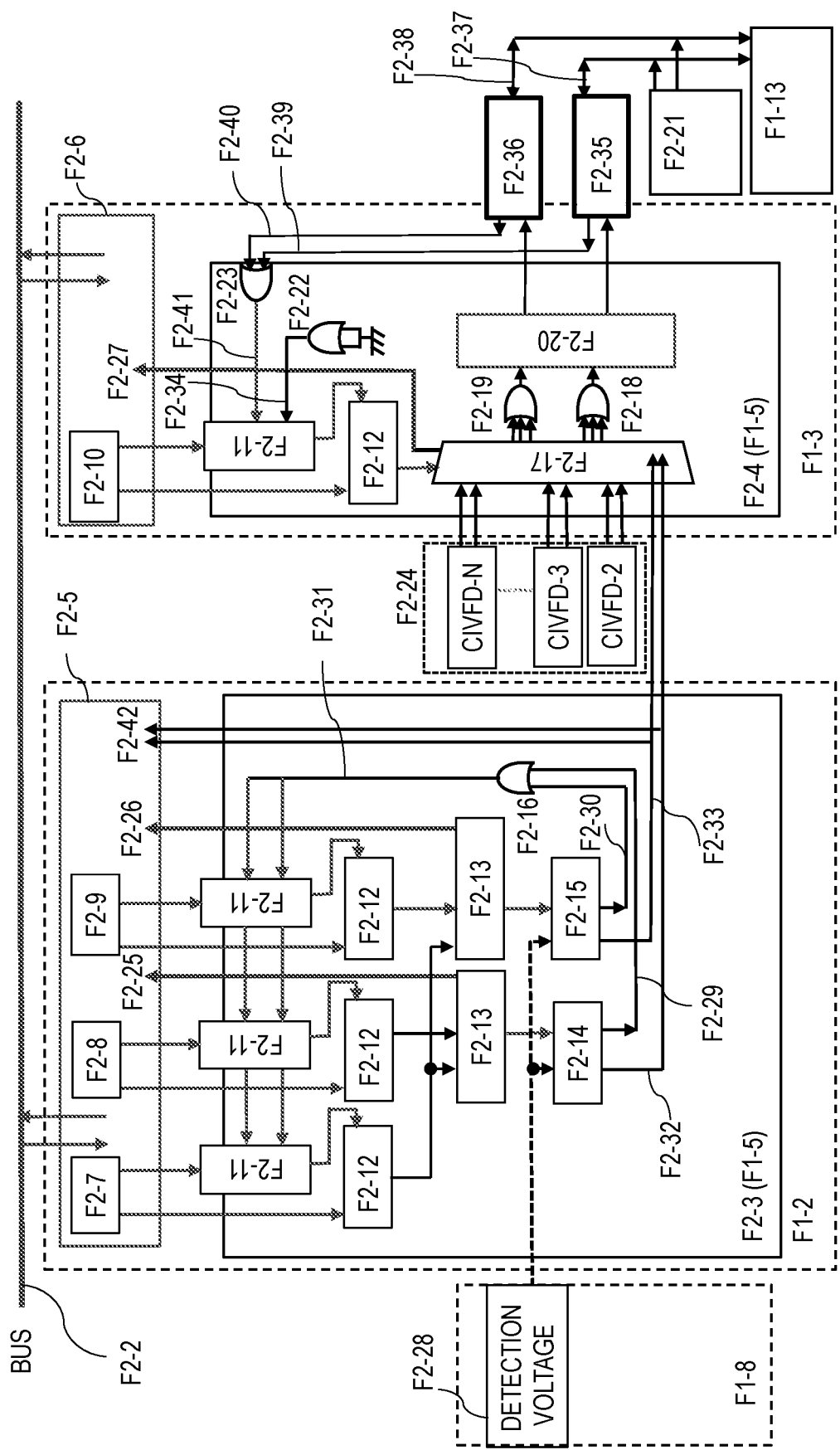
FIG. 2 is a block diagram of CIVFD and CIVFD outputs of FIG. 1.

FIG. 2 is a diagram illustrating the lower functional blocks within the blocks of CIVFD (F1-2-1 to 3) and CIVFD outputs (F1-3) of FIG. 1. This section describes how to detect abnormal power supply voltage of core power supply (logical system) used for CPU, GPU, BUS, etc. of SoC (F1-1).

Each block of FIG. 2 is disposed inside the SoC (F1-1) as shown in FIG. 1. CIVFD (F1-2) includes analog voltage area (F2-3) and logic area (F2-5), and logic area (F2-5) outputs temperature dependent component shift condition setting signal (F2-7), under lower limit voltage condition setting signal (F2-8), and over upper limit voltage condition setting signal (F2-9). Analog voltage area (F2-3), UVLSC (Unreliable voltage Level stabilization control circuit)(F2-11), latches (F2-12), a temperature dependent component shift unit (F2-13), an under lower limit voltage detection unit (F2-14), an over upper limit voltage detection unit (F2-15), and has a 2-input 1-output OR unit (F2-16).

CIVFD output (F1-3) includes analog voltage area (F2-4) and logic area (F2-10), and logic area (F2-10) outputs CIVFD setting signal (F2-10). The analog voltage area (F2-4) has a UVLSC (F2-11), a latch (F2-12), a selector (F2-17), a multi-input 1-output OR unit (F2-18, F2-19), an output buffer (F2-20), and a 2-input 1-output OR unit (F2-22, F2-23). In addition, the external module controller (F2-21) and the external module (F1-13) are connected via Vm_L_I/O (F2-35) and Vm_H_I/O (F2-36) of the external pins.

(Initialization of CIVFD and its Activation)

The L signals from the external module controller (F2-21) are supplied to the Vm_H_I/O (F2-36) and Vm_L_I/O (F2-35). It becomes L signal at the 2-input 1-output OR unit (F2-23), and is input to ULVSC (F2-11). The output of the under lower limit voltage detection unit (F2-14) and the over upper limit voltage detection unit (F2-15) outputs an L signal in the initial setting. In the analog voltage area (F2-3) of CIVFD (F1-2) and the analog voltage area (F2-3) of CIVFD output (F1-3), UVLSCs (F2-12) are set to pass the input signal as it is output. From BUS (F2-2), CIVFD (F1-2) acquires the data for the temperature dependent component shift condition setting signal (F2-7), under lower limit voltage condition setting signal (F2-8), and over upper limit voltage condition setting signal (F2-9) output by the logic area (F2-5). From BUS (F2-2), CIVFD output (F1-3) acquires the data for BUS (F2-2) setting signal CIVFD (F1-2) output by the logic area (F2-6).

Data from the temperature dependent component shift condition setting signal (F2-7), under lower limit voltage condition setting signal (F2-8), and over upper limit voltage condition setting signal (F2-9) output from the logic area (F2-5) of CIVFD (F1-2) is sent to the analog voltage area (F2-3) and latch (F2-11). Data from CIVFD setting signal (F2-10) of the logic area (F2-6) of CIVFD output (F1-3) is sent to UVLSC (F2-11) and the latch (F2-12) of the analog voltage area (F2-4). In CIVFD (F1-2), ULVSC (F2-11) of analog voltage area (F2-3) receives data and latches it. In CIVFD output (F1-3), ULVSC (F2-11) of analog voltage area (F2-4) receives data and latches it. The latched data in the analog voltage area (F2-3) of CIVFD (F1-2) is sent to the temperature dependent component shift unit (F2-13), the under lower limit voltage condition setting signal (F2-8) and the over upper limit voltage condition setting signal (F2-9) are temperature dependent component shifted by the temperature dependent component shift condition setting signal (F2-7) in the under lower limit voltage detection unit (F2-14) and the over upper limit voltage detection unit (F2-15), respectively, and the latched data in the analog voltage area (F2-4) of CIVFD output (F1-3) is sent to the selector (F2-17).

In CIVFD (F1-2), data from the temperature dependent component shift unit (F2-13) of the analog voltage area (F2-3) is sent to the readback capture (F2-25, F2-26) of the logic area (F2-5). In CIVFD output (F1-3), data from the selector (F2-17) of the analog voltage area (F2-4) is sent to the readback capture (F2-27) of the logic area (F2-6). Readback capture (F2-27) and CIVFD setting signal (F2-10) are compared, and if there is a discrepancy, an error process will be executed. If they are matched, the data of the readback capture (F2-25), temperature dependent component shift condition setting signal (F2-7), and under lower limit voltage setting signal (F2-8) are compared, and the data of the read back capture (F2-26) and temperature dependent component shift condition setting signal (F2-7) and over upper limit voltage setting signal (F2-9) are compared, and the error processing is performed. If they are matched, the output of the L signal from the external module controller (F2-21) is stopped, and the connections between the external module controller (F2-21) and Vm_L_I/O (F2-35) and Vm_H_I/O (F2-36) are set to the high-impedance setting. After that, CIVFD is then put into service. When error process was executed, L output from the external module controller (F2-31) to Vm_L_I/O (F2-35) and Vm_H_I/O (F2-36) continues, and CIVFD (F1-2) remains unusable.
(Voltage Detection in CIVFD)

The under low limit voltage detection unit (F2-14) and the over upper limit voltage detection unit (F2-15) detect whether the detection voltage (F2-28) of detection target is within the operation guaranteed voltage, or low, or high. If the detection voltage (F2-28) is within the operation guaranteed voltage, both of Vm_set_Under (F2-29) and Vm_Under (F2-32) maintain L, both of Vm_set_Over (F2-30) and Vm_Over (F2-33) of the over upper limit voltage detection unit (F2-15) maintain L. If the detection voltage (F2-28) is lower than the lower limit of the operation guaranteed voltage, Vm_set_Under (F2-29) and Vm_Under (F2-32) are set from L to H, and Vm_set_Over (F2-30) and Vm_Over (F2-33) maintain L. If the detection voltage (F2-28) is higher than the upper limit of the operation guaranteed voltage, both of Vm_set_Under (F2-29) and Vm_Under (F2-32) maintain L, Vm_set_Over (F2-30) and Vm_Over (F2-33) of the over-upper limit voltage detection unit (F2-15) are set from L to H. When the selector (F2-17) is set to select Vm_Under (F2-32) and Vm_Over (F2-33) of CIVFD (F2-24) at the initial setting, the Vm_Under (F2-32) and Vm_Over (F2-33) signals are processed with CIVFD (F2-24) selected by the selector (F2-17) and the multi-input 1-output OR unit (F2-18, F2-19). Output levels are set in the output buffer (F2-20). Data is output to external from Vm_H_I/O (F2-35) and Vm_L_I/O (F2-36). The signals of Vm_Under (F2-32) and Vm_Over (F2-33) are sent to the logic area (F2-5). On the other hand, when setting to select CIVFD Vm_Under (F2-32) and Vm_Over (F2-33) at initialization, data is not sent to the multi-input 1-output OR unit (F2-18, F2-19).

FIG. 3 shows the state (H or L) of the power supply voltage, the detected voltage corresponding thereto, Vm_H_I/O (F2-36), Vm_L_I/O (F2-35), Vm_set_Ou1 (F2-31), the state of Vm_set_Under (F2-29).

In the first embodiment, a plurality of CIVFD is mounted inside the SoC, and a selector and an OR circuit capable of selecting only CIVFD to be monitored. Thus, it is possible to detect the abnormal power supply voltage of the entire SoC interior and the abnormal power supply voltage of each power supply network. In addition, if a detection block of the abnormal power supply voltage is mounted with the lower and upper limits of the operation guaranteed power supply voltage range as a reference, and the power supply voltage of the core (logic system) used for the main logic circuit of the SoC becomes abnormal, this logic circuit may malfunction. Therefore, by a mechanism in which the information (signal) obtained when the power supply voltage is normal is maintained and information (signal) from the logic system is not accepted, it became possible to operate the abnormal power supply voltage detection normally without malfunction.

Figure 4:
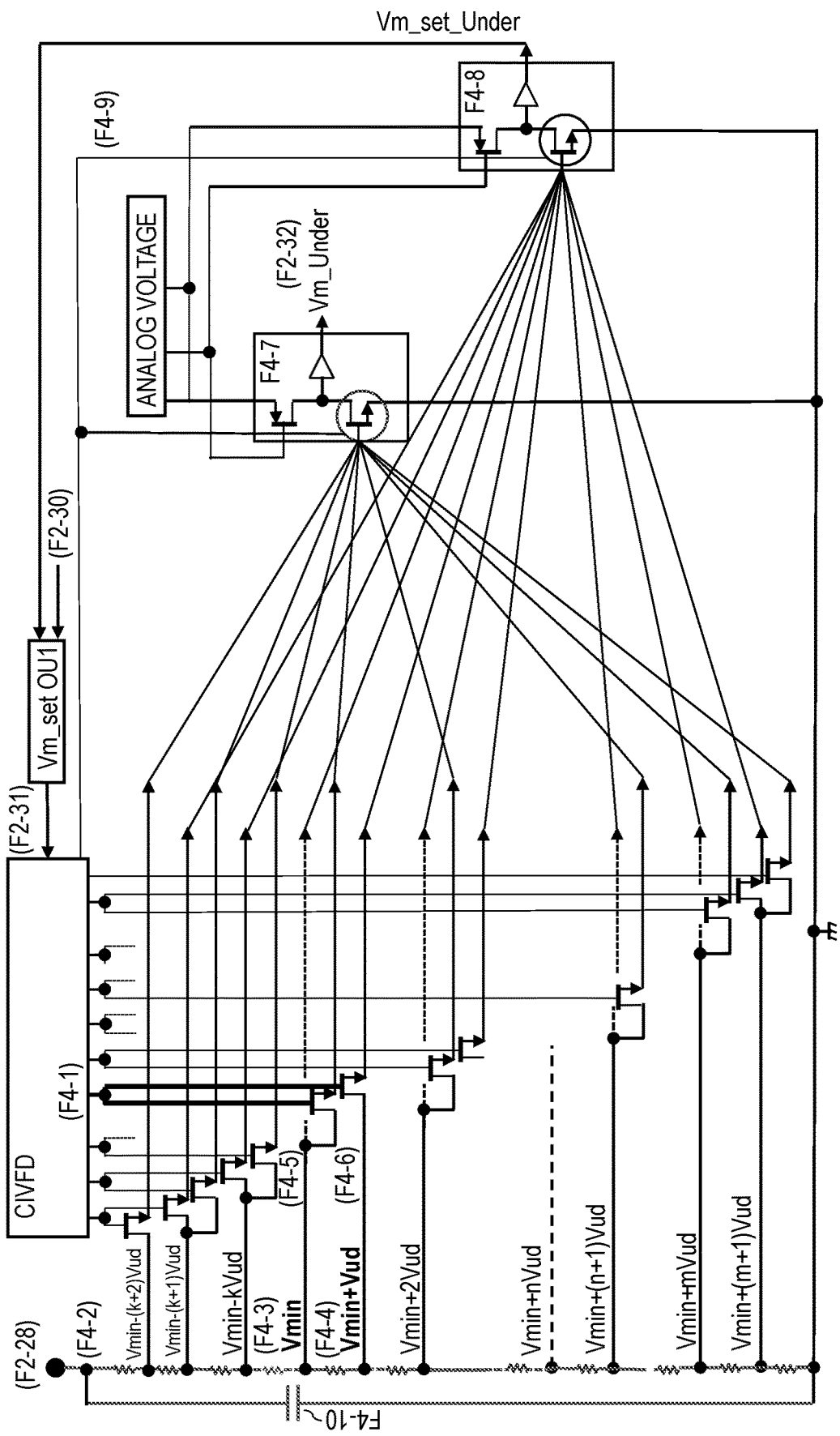
FIG. 4 is a block diagram showing an abnormal detection circuit configuration of the power supply voltage with reference to the lower limit of the operation guaranteed power supply voltage range in FIG. 2.

FIG. 4 is a block diagram for detecting whether or not below the lower limit voltage. Only the signal path selected by the output signal of the under lower limit voltage condition setting signal (F2-8) in the temperature dependent component shift unit (F2-13) is turned on. The detection voltage (F2-28) is divided by a ladder resistor. Vmin (F4-3) is the lower limit of the operation guaranteed power supply voltage range, which is the voltage divider position of the ladder resistor where the undervoltage detection (F4-7) turns on. Vmin+Vud (F4-4) is the voltage divider position of the ladder resistor under voltage setting unit (F4-8) turns on at Vmin (F4-3)+Vud. Vud indicates the resolution of the ladder resistance (i.e., unit of voltage divide). The voltage of Vmin (F4-3) is transmitted to the under voltage detection unit (F4-7) by turning on the switch (F4-5) of Vmin (F4-3) depending on the transistor characteristics of the chip by the signal (F4-1). The voltage of Vmin+Vud (F4-4) is transmitted to the under voltage setting unit (F4-8) by turning on the switch (F4-6) of Vmin+Vud (F4-4) depending on the transistor characteristics of the chip by the signal (F4-1). Under voltage detection unit (F4-7) detects the Vm_Under (F2-32) of the under voltage detection unit (F4-7) at Vmin position (F4-3) is ON/OFF. The under voltage setting unit (F4-8) turns ON/OFF the (F2-29) of the under voltage setting unit (F4-8) at the partial pressure value of the detected voltage is the Vmin+Vud (F4-4). The temperature characteristics of the under voltage detection unit (F4-7) and the under voltage setting unit (F4-8) are adjusted by the signal (F4-9) output signals of temperature dependent component shift condition setting unit (F2-7) in temperature dependent component shift unit (F2-13). A decoupling capacitor (F4-10) reduces the ac-noise of the detected voltages.

Figure 5:
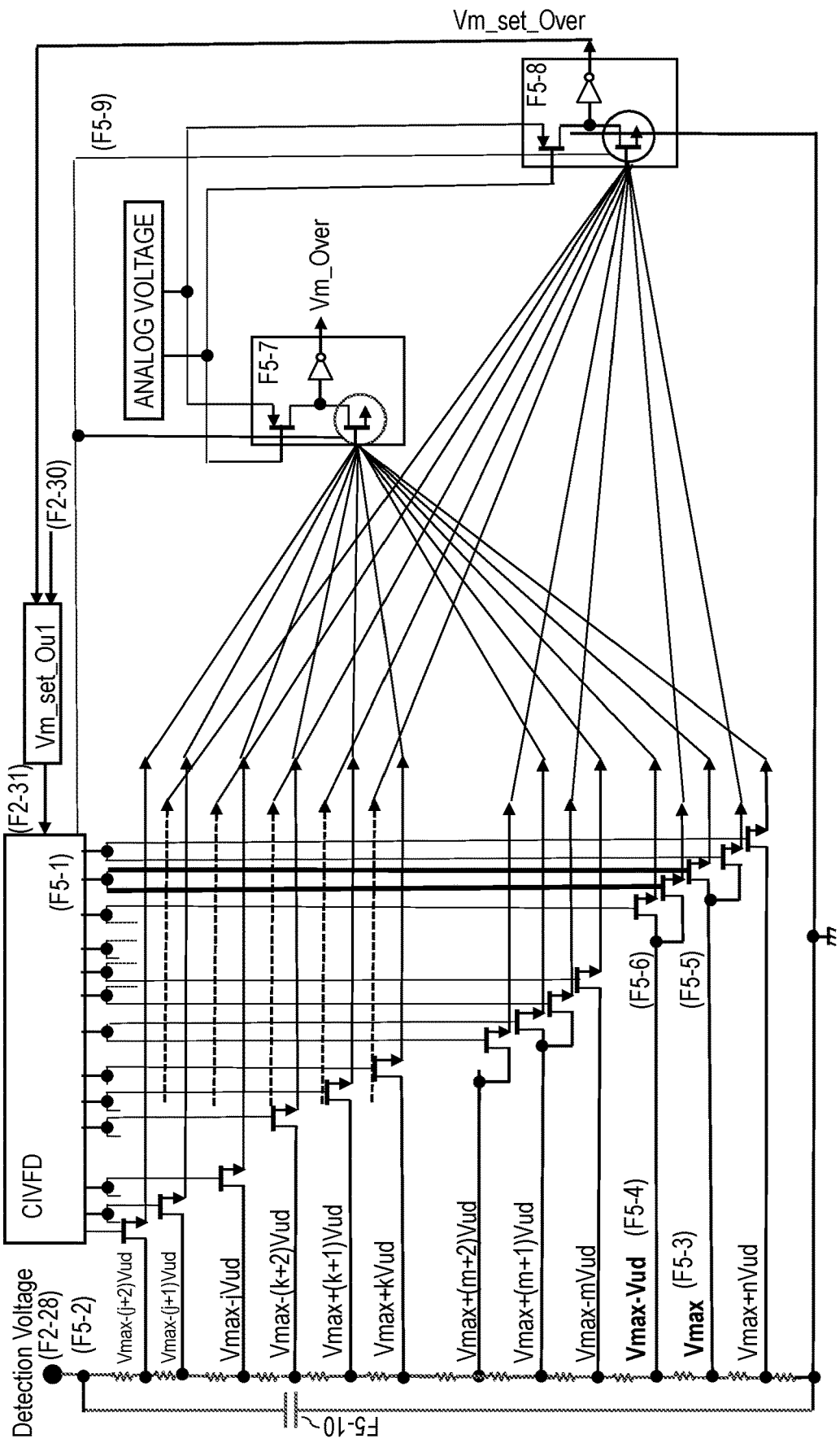
FIG. 5 is a block diagram showing an abnormal detection circuit configuration of the power supply voltage with reference to the upper limit of the operation guaranteed power supply voltage range in FIG. 2.

FIG. 5 is a block diagram for detecting whether it exceeds the upper voltage limit. In the position (F5-1), only the signal path selected by the output signal of the over high voltage condition setting signal (F2-9) is turned on by the temperature dependent component shift unit (F2-13). In the point (F5-2), the detection voltage (F2-28) is received, and the voltage is divided by the ladder resistor. The Vmax (F5-3) indicates the voltage divider position of the ladder resistor at which the over voltage detection unit (F5-7) turns on at the upper limit Vmax of the guaranteed operation power supply voltage range. The Vmax-Vud (F5-4) indicates the voltage divider position of the ladder resistor where the over voltage setting unit (F5-8) turns on in Vmax (F5-3)-Vud. Vud is the resolution of the ladder resistance (i.e., unit of voltage divide). The voltage of the Vmax (F5-3) is transmitted to the over voltage detection unit (F5-7) by turning on the switch (F5-5) at Vmax (F5-3) depending on the transistor characteristics of the chip by the signal (F5-1).

The voltage of the Vmax-Vud (F5-4) is transmitted to the over voltage setting unit (F5-8) by turning on the switch (F5-6) at Vmax point (F5-4) depending on the transistor characteristics of the chip by the signal (F5-1). Vm_over (F2-33) of the over voltage detection unit (F5-7) is ON/OFF at the voltage divider where the detected voltage is the Vmax (F5-3). Vm_set_Over (F2-30) of the over voltage setting unit (F5-8) is ON/OFF at the voltage divider where the detected voltage is the Vmax-Vud (F5-4). The temperature characteristics of the over voltage detection unit (F5-7) and the over voltage setting unit (F5-8) are adjusted by the output signals (F5-9) of temperature dependent component shift condition setting signal (F2-7) in temperature dependent component shift unit (F2-13). A coupling capacitor (F5-10) reduces ac noises in the detection voltages.

FIG. 6 is a diagram for explaining the operation of FIGS. 4 and 5. (A) takes the transition of the detected voltage on the vertical axis and the horizontal axis, the lower limit of the operation guaranteed power supply voltage Vmin, and the upper limit value as a Vmax, these inner range and the value of the Vud inside than these, i.e. it shows the voltage positional relationship between Vmin+Vud and Vmax-Vud. (B) shows the waveform of each terminal. (B-3) shows the transition of the following voltages. In case of L, the temperature dependent component shift condition setting signal (F2-7), under lower limit voltage condition setting signal (F2-8), and over upper limit voltage condition setting signal (F2-9) of the logic area (F2-5) are incorporated into the analog voltage area (F2-3) of CIVFD (F1-2). In case of H, the value captured by the logic area (F2-5) and latch (F2-12) is maintained, and the new setting of the logic area (F2-5) is not accepted. (B-4) shows that the power supply voltage is abnormal because the power supply voltage is within the guaranteed operation voltage range in the case of L and is outside the guaranteed operation power supply voltage range in the case of H.

(Initial Test when Detecting Whether the Voltage is Below the Lower Limit)

When performing an initial test subject as a product test, first, the detection voltage (F2-28) of the area to be monitored is taken from the terminal (F4-2). When the captured detection voltage (F2-28) reaches the upper limit Vmax of the operation guaranteed power supply voltage range, the under voltage detection circuit (F4-7) is turned on. The position (F4-5) which connects Vmin (F4-3) to the under voltage detection unit (F4-7) is turned on. When testing signal (F4-1) on a chip-by-chip basis and on a module-by-module basis, set the power supply voltage as well as the guaranteed operating temperature Tj. The tested results are recorded via BUS (F2-2) to a non-volatile register, such as a Fuse, controlled by logic area (F2-5) or logic area (F2-5) or SoC (F2-1). This recording is classified into two types: temperature dependent component shift condition setting signal (F2-7) and under lower limit voltage condition setting signal (F2-8).

(Circuit Used to Detect Whether the Voltage is Below the Lower Limit.)

First, the detection voltage of the area to be monitored is captured from the terminal (F4-2). The desired value is set to the temperature dependent component shift condition setting signal (F2-7) and under lower limit voltage condition setting signal (F2-8) multiple times and compared with the value of readback capture (F2-25). As a result of comparing, if there is a mismatch, all settings of the under lower limit voltage condition setting signal (F2-8) are selected within the logic area (F2-5). In other words, the signal (F4-1) turns on all switch (F4-5) and switch (F4-6). If they coincide, the values obtained in the test is read into the temperature dependent component shift condition setting signal (F2-7) and under lower limit voltage condition setting signal (F2-8) in the logic area (F2-5). The signal (F4-1) is determined in the temperature dependent component shift unit (F2-13) via UVLSC (F2-11) and latch (F2-12), and Switch (F4-5) and switch (F4-6) are turned on. Vm_set_Under (F2-29) is checked whether H or L. In case of H, Vm_set_Ou1 (F2-31) turns ON, and holds the values of the temperature dependent component shift condition setting signal (F2-7) and under lower limit voltage condition setting signal (F2-8) latched by ULVSC (F2-11). In case of L, when Vm_set_over (F2-30) is L, the hold of the value latched by UVLSC (F2-11) is released. In addition, whether Vm_Under (F2-32) is H or L is checked, and if it is L, whether Vm_set_Under (F2-29) is H or L is checked again. If it is H, it is sent to the selector (F2-17) that the detection voltage is less than or equal to Vmin.

(Initial Test when Detecting Whether the Voltage is Above the Upper Limit Voltage)

First, the detection voltage is taken into the point (F5-2). The over voltage detection unit (F5-7) turns on when the detection voltage is at the upper limit Vmax of the guaranteed operation power supply voltage range. The switch (F5-5) which connects the Vmax (F5-3) to the over voltage detection unit (F5-7) is turned on. When testing, the signal (F5-1) on a chip-by-chip basis and on a module-by-module basis, set the power supply voltage as well as the guaranteed operating temperature Tj. The tested results are recorded via BUS (F2-2) to a non-volatile register such as a Fuse controlled by logic area (F2-5) or logic area (F2-5) or SoC (F2-1). This recording is classified into two types: temperature dependent component condition setting signal (F2-7) and under lower limit voltage condition setting signal (F2-8).

(Circuit Operation when Detecting Whether the Voltage is Higher than the Upper Limit Voltage)

First, the detected voltages are taken into the terminal (F5-2). This property is used to set the temperature dependent component shift condition setting signal (F2-7) and under lower limit voltage condition setting signal (F2-8) multiple times as desired and to compare them with readback capture (F2-26). When the result of the comparison is mismatch, all the settings of the over upper limit voltage condition setting signal (F2-9) are selected within the logic area (F2-5), that is, the signal (F5-1) turns on all switch (F5-5) and switch (F5-6). As a result of comparisons, the values obtained in the tests are read into the temperature dependent component shift condition setting signal (F2-7) and over upper limit voltage condition setting signal (F2-9) in the logic area (F2-5) if they are matched. Through UVLSC (F2-11) and latch (F2-12), the signal (F5-1) is determined in the temperature dependent component shift unit (F2-13), and the switch (F5-5) and the switch (F5-6) is turned on. When Vm_set_Over (F2-30) is H, Vm_set_Ou1 (F2-31) turns on and the value of the temperature dependent component shift condition setting signal (F2-7) and the over-upper-limit voltage condition setting signal (F2-9) latched by UVLSC (F2-11) is held. When Vm_set_Over (F2-30) is L, the hold of the value latched by UVLSC (F2-11) is released. Whether Vm_Over (F2-33) is H or L is checked. If it is L, processing returns to start. For H, it transmits to the selector (F2-17) that the detection voltage (F2-28) is Vmax or more.

Figure 7:
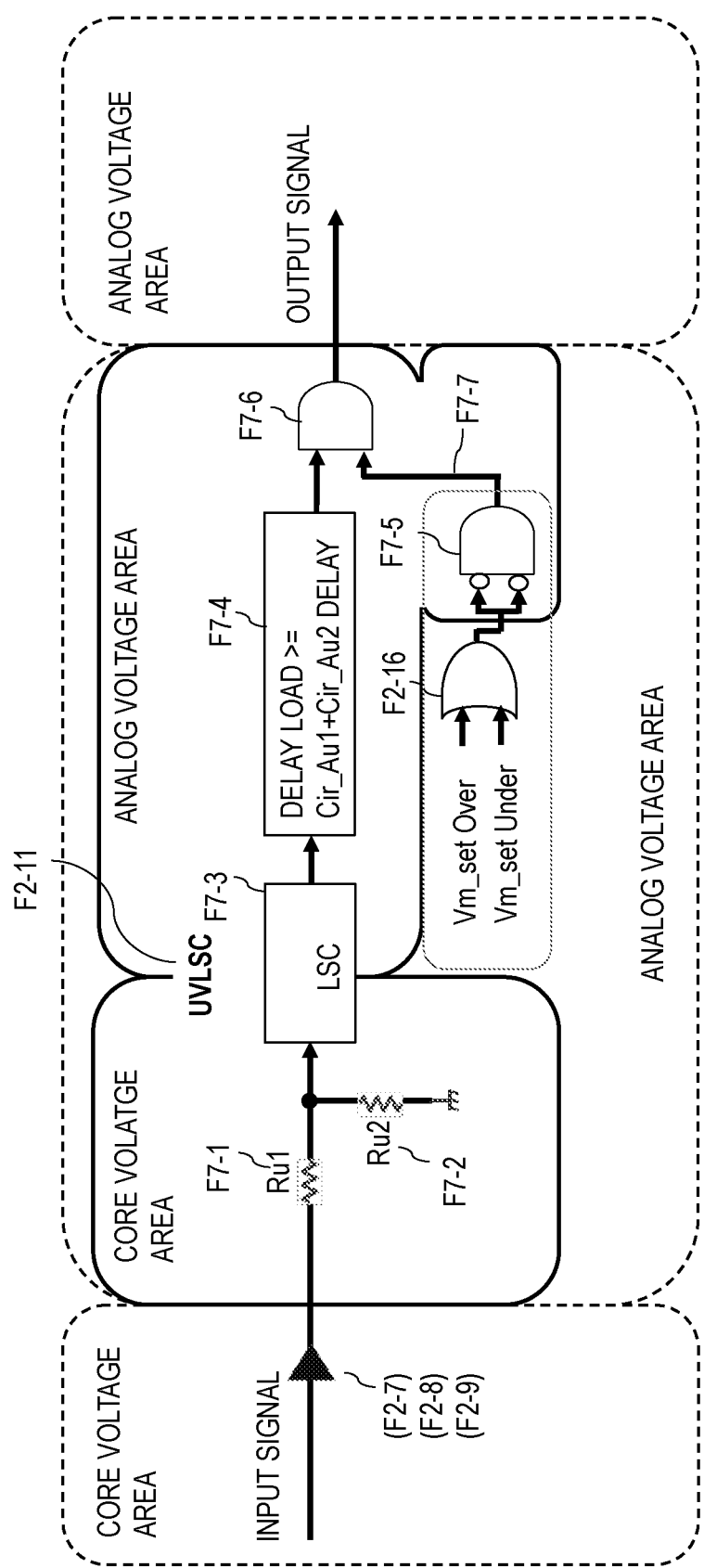
FIG. 7 is a block diagram showing the circuit configuration of UVLSC.
Figure 8:
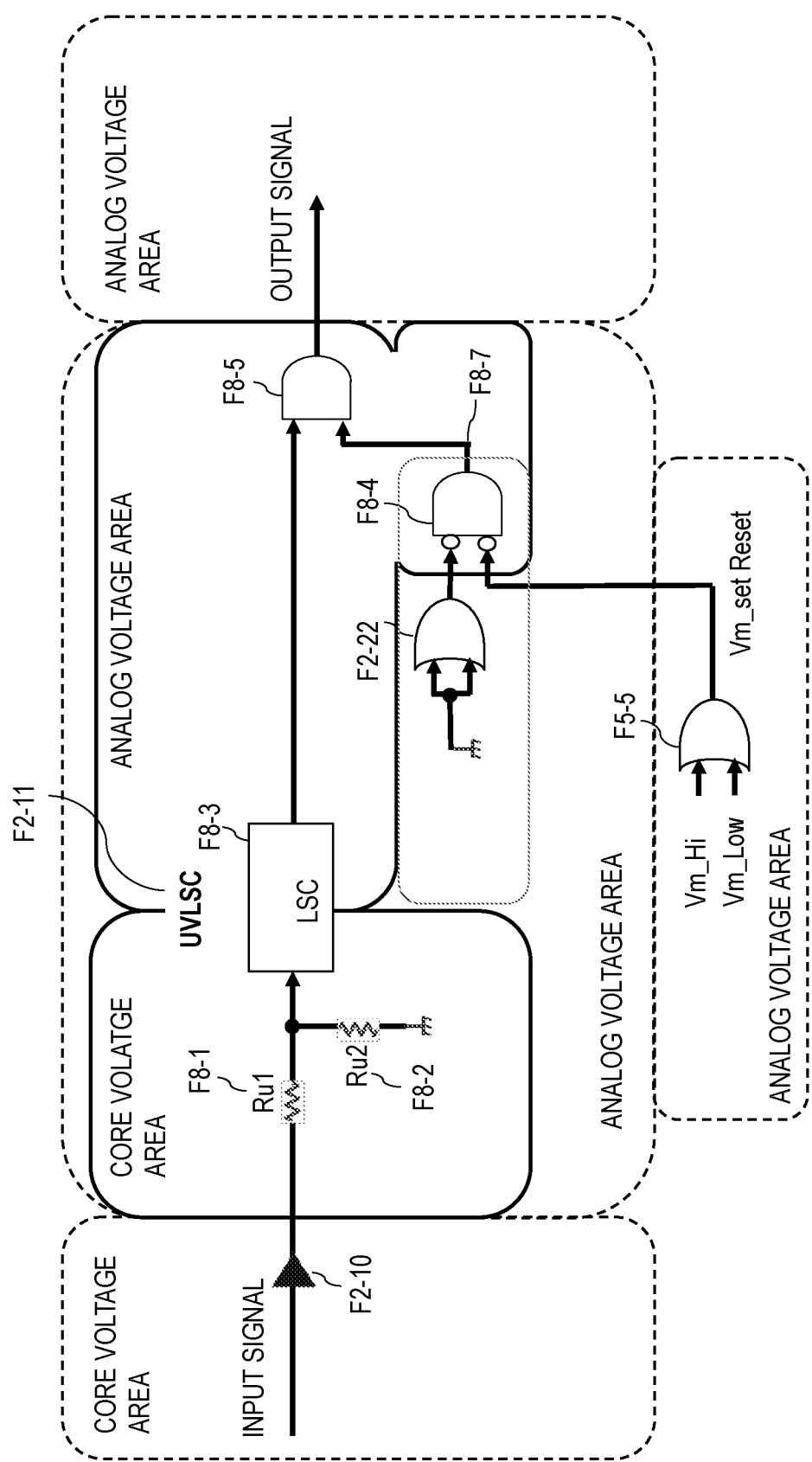
FIG. 8 is a block diagram showing the circuit configuration of UVLSC.

FIGS. 7 and 8 is a circuit configuration diagram of UVLSC (F2-11) of FIG. 2. When the power supply voltage is abnormal, the output of UVLSC (F2-11) is fixed to L and the latch (F2-12) is held. On the other hand, when the power supply voltage is normal, the output of UVLSC (F2-11) can be set to H or L, and the set/reset of ULVSC (F2-11) can be controlled. Thus, the temperature dependent component shift condition setting signal (F2-7), the under lower limit voltage condition setting signal (F2-8), the over upper limit voltage condition setting signal (F2-9), and CVIFD setting signal (F2-10) can be taken into the analog voltage area (F2-3, 4). Although the basic circuit configuration is the same, by handling the abnormal power supply voltage, it will be described by dividing into the circuit configuration of FIGS. 7 and 8.

FIG. 7 is a schematic diagram of a UVLSC (F2-11). Ru1 resistor (F7-1), Ru2 resistance (F7-2), LSC level shifter (F7-3), delay load (F7-4), Not 2-input 1-output AND unit (F7-5), has a 2-input 1-output AND unit (F7-6). Cir-Au1 shows the delay times of the total signal transmission of Vm_set_Under (F2-29) or Vm_set_Over (F2-30), 2-input 1-output OR (F2-16), Vm_set_Ou1 (F2-31), and (F7-5). Cir-Au2 shows the signal transmission delay times of the under voltage setting unit (F4-8) and the over voltage setting unit (F5-8). This applies to the functional circuit area (F1-8-1) and the core voltage area (F1-8-4) CIVFD (F1-2-1-3) in FIG. 1. There is one or more CIVFD (F1-2) in the core voltage area (F1-8), one of which is CIVFD (F1-2) the core power source and the detected voltage at the location must be matched. This is to prevent the latch (F2-12) from being held by UVLSC (F2-11) when the abnormality detection location is a normal voltage at a distance from the location of (CIVFD (F1-2) and the voltage at the location where CIVFD (F1-2) is located is abnormal.

FIG. 8 is a schematic diagram of a UVLSC F2-11). Ru1 resistor (F8-1), a Ru2 resistor (F8-2), a level shifter (F8-3), a Not 2-input 1-output AND unit (F8-4), a 2-input 1-output AND unit (F8-5). Cir-Au1 indicates the delay time of the sum signal transmission of Vm_set_Under (F2-29) or Vm_set_Over (F2-30), 2-input 1-output OR unit (F2-16), Vm_set_Ou1 (F2-31), and (F8-5), Cir-Au2 indicates the signal transmission delay time of the undervoltage set unit (F4-8), overvoltage set unit (F5-8) respectively. This applies to CIVFD output (F1-3) in FIG. 1. CIVFD outputs (F1-3) receive Vm_Under (F2-32) and Vm_Over (F2-33) signals from a plurality of CIVFD (F1-2) as shown in a plurality of CIVFD (F2-24. If any CIVFD (F1-2) of the power supply voltage becomes abnormal, when CIVFD (F1-2) notifies the abnormal CIVFD output (F1-3) in a plurality of CIVFD (F2-24), if the power supply in the vicinity of CIVFD output (F1-3) is normal, the control of the abnormal state of the abnormal state in the abnormal site CIVFD output (F1-3) may be received, by generating a signal of Vm_set_Reset (F2-41) in vmR_H (F2-39) and vmR_L (F2-40), using the external terminal of the SoC (F1-1), it is controlled from the outside.

(Circuit Operation when the Core Power Supply Voltage is within the Operation Guaranteed Power Supply Voltage Range)

This property indicates the operation flow in which the latch (F2-12) set/reset of the analog voltage area (F2-3) of CIVFD can be controlled, and the data of the temperature dependent component shift condition setting signal (F2-7), under lower limit voltage condition setting signal (F2-8), and over upper limit voltage condition setting signal (F2-9) can be set to latch (F2-12). First, the signals that control the latch (F2-12) of the temperature dependent component shift condition setting signal (F2-7), the under lower limit voltage condition setting signal (F2-8), and the over upper limit voltage condition setting signal (F2-9) are loaded into the Ru1 resistor (F7-1) of UVLSC (F2-11). The signal is passed to delay set unit (F7-4) through Ru1 resistor (F7-1), Ru2 resistance (F7-2), and LSC level shifter (F7-3) after converting the voltage level from the core voltage area to the analog voltage area. Since Vm_set_Under (F2-29) and Vm_set_Over (F2-30) are both L in case of the operation guaranteed power supply voltage range, H is input to the 2-input 1-output AND unit (F7-6). The control signals of the latch (F2-12) of the analog voltage area (F2-3) are captured in the same flow. At this time, it is possible to set either "latch set L" or "reset H". The latch (F2-12) in the analog voltage area (F2-3) is reset and set to set the data of the temperature dependent component shift condition setting signal (F2-7), under lower limit voltage condition setting signal (F2-8), and over upper limit voltage condition setting signal (F2-9).

(Circuit Operation when the Core Power Supply Voltage is Out of the Guaranteed Operation Power Supply Voltage Range During SoC Operation after Initial Setting)

It is impossible to control set or reset of the latch (F2-12) of the analog voltage area (F2-3) of CIVFD (F1-2). Therefore it is impossible to set the data of the temperature dependent component shift condition setting signal (F2-7), under lower limit voltage condition setting signal (F2-8), and over upper limit voltage condition setting signal (F2-9) to the latch (F2-12). First, it was used in L (set) after initialization to load the signals for controlling the latch (F2-12) of the temperature dependent component shift condition setting signal (F2-7), the under lower limit voltage condition setting signal (F2-8), and the over upper limit voltage condition setting signal (F2-9) to Ru1 resistor (F7-1) of each UVLSC (F2-11). However, it is assumed that H (reset) occurred due to an abnormal power supply voltage. When the power supply voltage is abnormal, there are cases where the voltage noise increases, or power is unstable. By Ru1 resistor (F7-1) and Ru2 resistor (F7-2), the voltage noise is suppressed, and unstable state is pulled to L, and then the signal is passed to the LSC level shifter (F7-3). The signal is passed to the delay set unit (F7-4) through Ru1 resistance (F7-1), Ru2 resistance (F7-2), and LSC level shifter (F7-3) after converting the voltage level from the core voltage area to the analog voltage area. In the delay set unit (F7-4), transmission delay time of more than Cir_Au1 (F7-7)+Cir_Au2 (F7-8) is added to the signal, and then H is inputted to the 2-input 1-output AND unit (F7-6) (the signal switches from L to H). When the power supply voltage is abnormal, Vm_set_Under (F2-29) or Vm_set_Over (F2-30) becomes H. L is inputted to 2-input 1-output AND unit (F7-6) through 2-input 1-output OR unit (F2-16), Vm_set_Ou1 (F2-31) and 2-input 1-output AND unit (F7-5). Furthermore, the signal transmission delay time from the power supply voltage becomes abnormal to input L to the 2-input 1-output AND unit (F7-6) (in other words, signal switches from H to L) becomes Cir_Au1 (F7-7). Because the output of the 2-input 1-output AND unit (F7-5) (the time until input 2-input 1-output AND unit (F7-6) switches from H to L) is earlier than the output of the delay set unit (F7-4) (the time until input to 2-input 1-output AND unit (F7-6) switches from L to H), is earlier, the latch (F2-12) of the analog voltage area (F2-3) of CIVFD (F1-2) is kept in a set state. Thus, even if the setting signals of the temperature dependent component shift condition setting signal (F2-7), the under lower limit voltage condition setting signal (F2-8), and the over upper limit voltage condition setting signal (F2-9) change to incorrect data due to the abnormal power supply voltage, the setting data latched by the latch (F2-12) in the analog voltage area (F2-3) of CIVFD (F1-2) is retained.

(Circuit Operation when the Core Power Supply Voltage is within the Operation Guaranteed Power Supply Voltage Range)

It is possible to control set/reset the latch (F2-12) of the analog voltage area (F2-4) of CIVFD output (F1-3), and the data of CIVFD setting signal (F2-10) can be set to latch (F2-12). First, both vmR_H (F2-39) and vmR_L (F2-40) are set to L from the external module controller (F2-21). Vm_set_Reset (F2-41) becomes L, and the 2-input 1-output AND unit (F8-5) becomes H. The signal that controls the latch (F2-12) of CIVFD setting signal (F2-10) is taken into Ru1 resistor (F8-1) of UVLSC (F2-11). Through Ru1 resistor (F8-1), Ru2 resistor (F8-2) and the LSC level shifter (F8-3), the signal is passed to the 2-input 1-output AND unit (F8-5) after converting voltage level conversion from the core voltage area to the analog voltage area. In the same way, the control signal of the latch (F2-12) in the analog voltage area (F2-4) of CIVFD output (F1-3) is captured. At this time, it is possible to set either "latch set L" or "reset H". The latch (F2-12) in the analog voltage area (F2-4) of CIVFD output (F1-3) is reset, and the data of CIVFD setting signal (F2-10) is set. The latch (F2-12) in the analog voltage area (F2-4) of CIVFD output (F1-3) is set and held by the latch (F2-12).

(Operation when the Core Power Supply Voltage is within the Operation Guaranteed Power Supply Voltage Range and the Core Power Supply Voltage is Outside the Operation Guaranteed Power Supply Voltage Range During SoC Operation after Initial Setting)

Operation flow is described when it is impossible to control set/reset of the latch (F2-12) of the analog voltage area (F2-4) of CICVFD output (F1-3) and set the data of CIVFD setting signal (F2-10) to latch (F2-12). First, vmR_H (F2-39) and vmR_L (F2-40) do not both become L unless the analog output area of CIVFD output (F1-3) is OFF or both are set to L using the external module controller (F2-21). Outputs of the external module controller (F2-21) are set to high impedance (or OPEN). Vm_set_Reset (F2-41) becomes L, and the 2-input 1-output AND unit (F8-5) becomes L. The signal that controls the latch (F2-12) of CIVFD setting signal (F2-10) is loaded into the (F8-1) of ULVSC (F2-11). Through Ru1 resistor (F8-1), Ru2 resistor (F8-2) and the LSC level shifter (F8-3), the signal is passed to the 2-input 1-output AND unit (F8-5) after converting a voltage level conversion from the core voltage area to the analog voltage area. Since the input to the 2-input 1-output AND unit (F8-5) is L, the output of the 2-input 1-output AND unit (F8-5) holds L, regardless of the input H/L to the 2-input 1-output AND unit (F8-5). The setting data latched by the latch (F2-12) in the analog voltage area (F2-4) of CIVFD output (F1-3) is retained.

(Field Test)

The core power supply voltage is within the operation guaranteed power supply voltage range, under the conditions, it is possible to test detection function circuit group (module) for the abnormal power supply voltage (field test). During use, it is not permissible to operate the power supply voltage (to make it an abnormal voltage) for testing purposes. As a correspondence, by changing the temperature dependent component shift condition setting signal (F2-7), the under lower limit voltage setting signal (F2-8), and the over upper limit voltage setting signal (F2-9) in the logic area (F2-5) in the control and logic system in the SoC, the abnormal power supply voltage detection device even if within the operation guaranteed power supply voltage range, it is possible to perform the operation in abnormal power supply voltage. Since it is controlled by the operation and logic system in the SoC, it can be operated by distinguishing whether the test is being carried out or in use.

Second Embodiment

Figure 9:
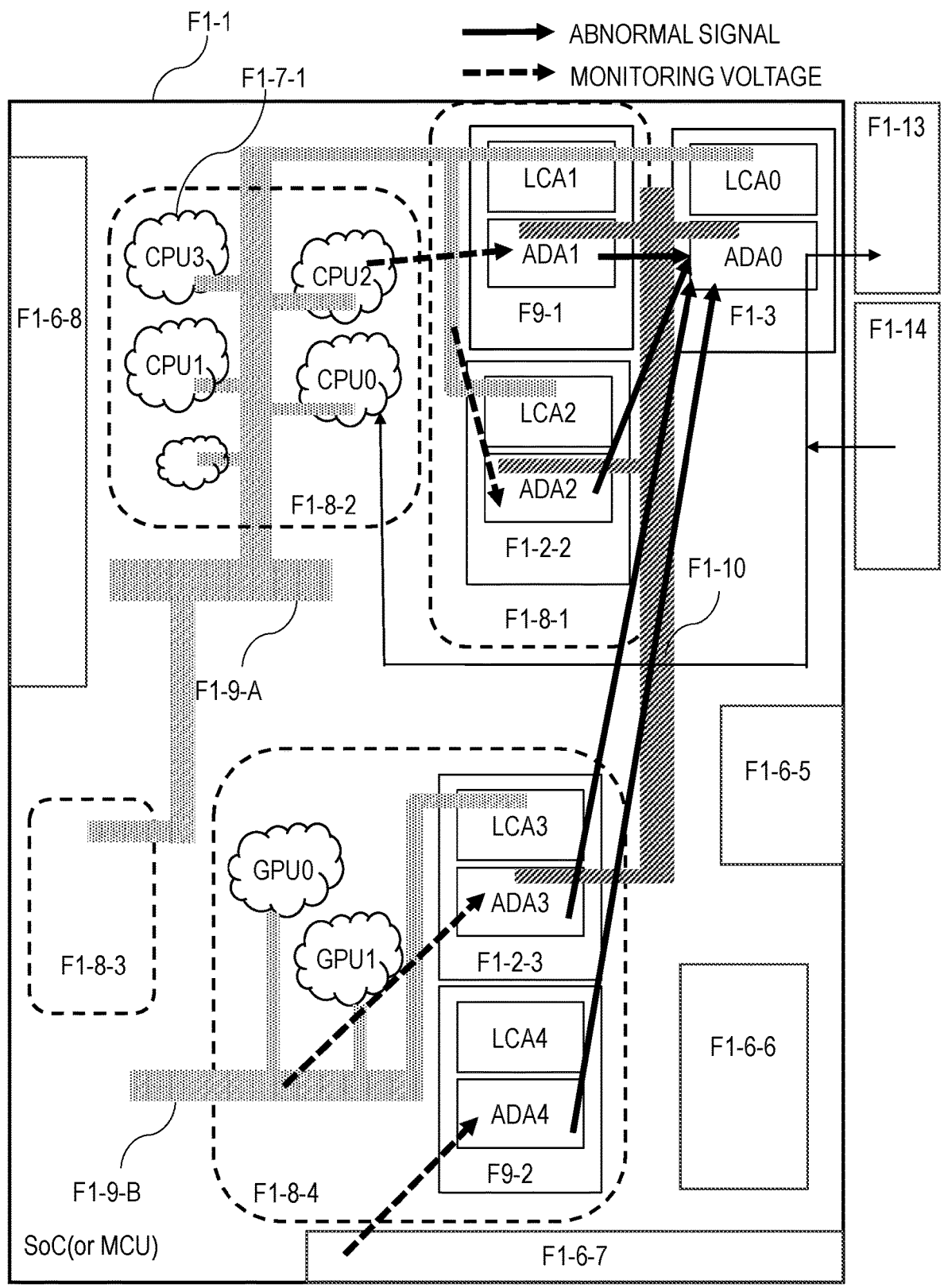
FIG. 9 is a block diagram of a SoC of the abnormal power supply voltage detection module according to the second embodiment.

FIG. 9 is a block diagram of a SoC of the abnormal power supply voltage detection device of the second embodiment. In the second embodiment, compared with the first embodiment, detection of abnormal power supply voltage is changed to CPU2 of the power supply separation area (F1-7-1) from the core voltage power supply line A, and CIVFD (F9-2) is added. Incidentally, although only a CPU2 is mentioned as an example, it may be provided CIVFD to plurality of CPUs and GPUs having a power-off area respectively. Although only the digital or analog exclusive voltage area (F1-6-7) is mentioned, CIVFD #SM may be provided in the respective digital or analog exclusive voltage area. The digital voltage also includes the core power supply voltage.

Figure 10:
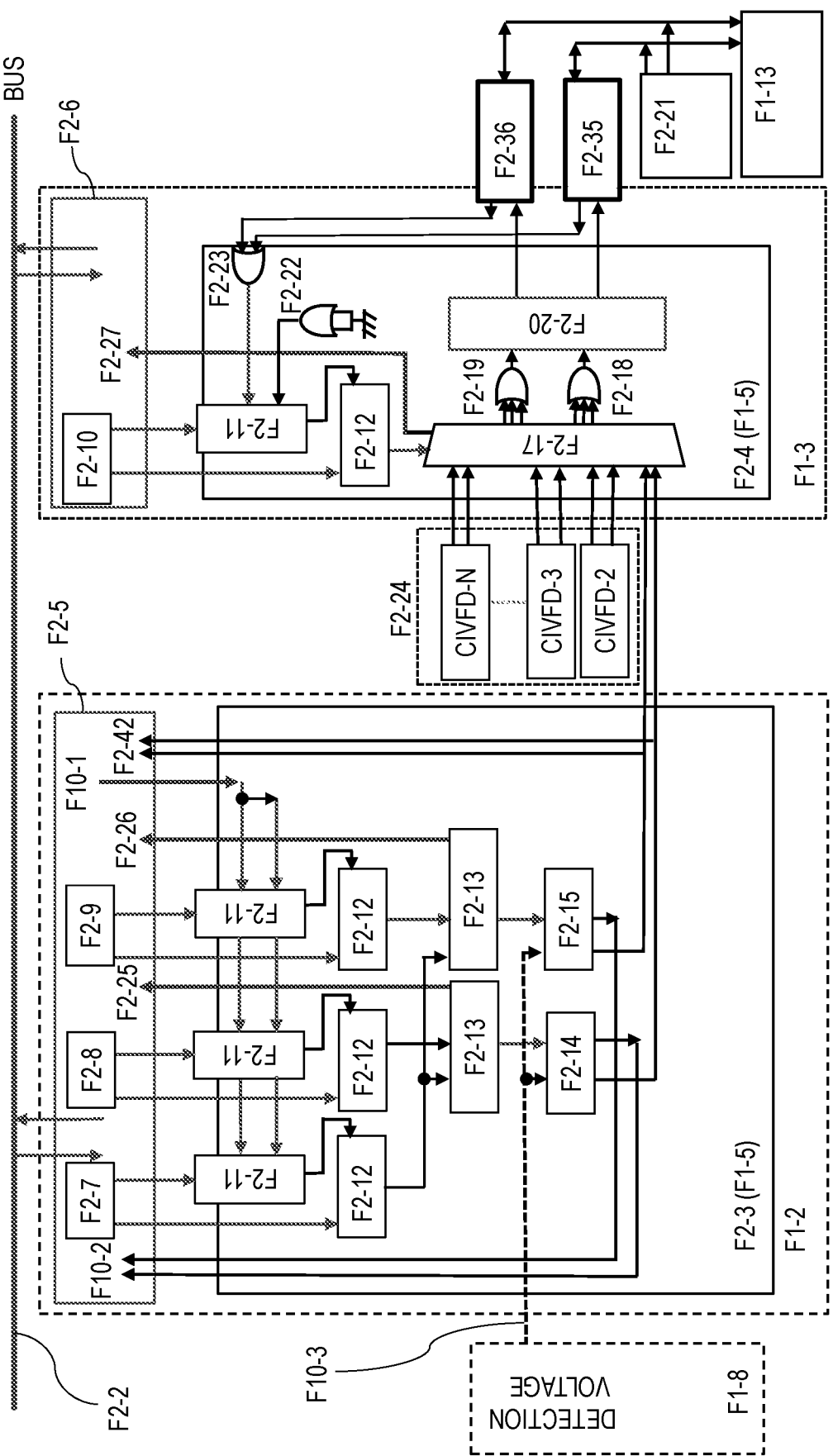
FIG. 10 is a block diagram of CIVFD and CIVFD outputs of FIG. 9.

Further, compared with the first embodiment, referring to FIG. 10, in the second embodiment, the 2-input 1-output OR unit (F2-23) receiving input from the Vm_set_under (F2-29) and the 2-input 1-output OR unit (F2-16) is changed to signal (F10-1), and also the output destination of Vm_set_under (F2-29), Vm_set_over (F2-30) is changed to signal (F10-2).

(Detection of Abnormal Power Supply Voltage of CPU2)

First, by the methods of the first embodiment, whether CIVFD (F1-2-2) is operating within the guaranteed operating power supply voltages is checked. As a result of check, it is determined whether CIVFD (F1-2-2) is operating within the operation guaranteed power supply voltage range. If it is determined that the power shutdown, take the correspondence of the abnormal detection of the core power supply voltage shown in the first embodiment. At this time, abnormal voltages of CIVFD #S1 (F9-1) are not detected. On the other hand, if it is determined that the power supply is not shut off, by setting L to signal (F10-1), the flow from CIVFD initialization to the start of use is executed to CIVFD #SM. For example, it is implemented in CIVFD #S1. Furthermore, it is determined whether or not CPU2 is turned off by the information processing in the SoC (F1-1), when it is determined that the power is turned off, Vm_Under (F2-32) becomes H, the signal is transmitted to the selector (F2-17) as an abnormal voltage lower than lower limit of the operation guaranteed power supply voltage. Furthermore, it is selected by the selector (F2-17), it may be performed outputting an abnormal voltage. By non-selection control of CPU2 in SoC (F1-1), it is not selected by the selector (F2-17). It may be processed in SoC (F1-1) by signal (F10-2). For example, when the power supply voltage is detected while the power supply voltage of CPU2 is shut off, the failsafe process is performed in the SoC (F1-1).

Next, by the method of the first embodiment whether CIVFD #S1 (F9-1) of the functional circuit area (F1-8-1) is operating within the operation guaranteed power supply voltage range is checked. However, the method of the first embodiment is performed after checked that there is no abnormal state in core (logic) power supply voltage. The operation of Vm_set_Under (F2-29) and Vm_set_Over (F2-30) differs from the first embodiment, they operate by setting of the signal (F10-1). The latch (F2-12) of CIVFD #S2 (F9-2) is reset by L. The latch (F2-12) of CIVFD #S1 (F9-1) is set at H. As a supplementary, CIVFD #S1 (F9-1) is selected by the operation guaranteed power supply voltage range out (when the power supply voltage is abnormal) selector (F2-17), it may be performed output of the voltage error. It may be processed in SoC (F1-1) by signal (F10-2). Both may be performed.

(Abnormal Power Supply Voltage Detection Operation of CIVFD)

First, it is confirmed in the manner of the first embodiment whether CIVFD (F1-2-3) is operating within the operation guaranteed power supply voltages. As a result of checking, CIVFD (F1-2-3) determines whether the product is operating within the operation guaranteed power supply voltage range. If operation is not within the guaranteed operating voltage (that is, power shutdown occurs, the abnormal detection of the core (logic system) power supply voltage shown in the first embodiment is taken. At this time, the abnormal voltage detection of CIVFD #S2 (F9-2) is not performed. On the other hand, when the operation is within the guaranteed operating voltage, that is, the power supply is not shut off, the flow from the initial setting of CIVFD in FIG. 3 to the start of use is set to L to CIVFD #SM. For example, it is performed to CIVFD #S2 (F9-2).

Next, in the information processing in the SoC (F1-1), it is checked whether or not the digital/analog exclusive voltage domain (F1-6-7) is powered off. When the power is turned off, Vm_Under (F2-32) becomes H, and the signal is transmitted to the selector (F2-17) as an abnormal voltage lower than the guaranteed operation power supply voltage lower limit. Furthermore, it is selected by the selector (F2-17), it may be performed outputting a voltage error. The CPU of the SoC (F1-1), may be processed in the SoC (F1-1). For example, if a power supply voltage is observed while the digital or analog exclusive voltage area (F1-6-7) is powered off, a failsafe process is performed in the SoC (F1-1). On the other hand, if the power supply is not shut off, use Embodiment 1 to check if CIVFD #S2 (F9-2) is operating within the guaranteed operating power supply voltage. However, when detecting an abnormal power supply voltage of the core (logic system), the operation of Vm_set_Under (F2-29) and Vm_set_Over (F2-30) that is executed after confirming that there is no abnormality operates with the setting of (F10-1) unlike first embodiment. Latch (F2-12) of CIVFD #2 (F9-2) is reset by L. Latch (F2-12) of CIVFD #S2 (F9-2) is set by H. Furthermore, when CIVFD #S2 (F9-2) is out of the operation guaranteed power supply voltage range (when the power supply voltage is abnormal), it may be selected by the selector (F2-17) and outputted of the abnormal voltage. It may be processed in SoC (F1-1) by signal (F10-2). Both may be performed.

Third Embodiment

Figure 11:
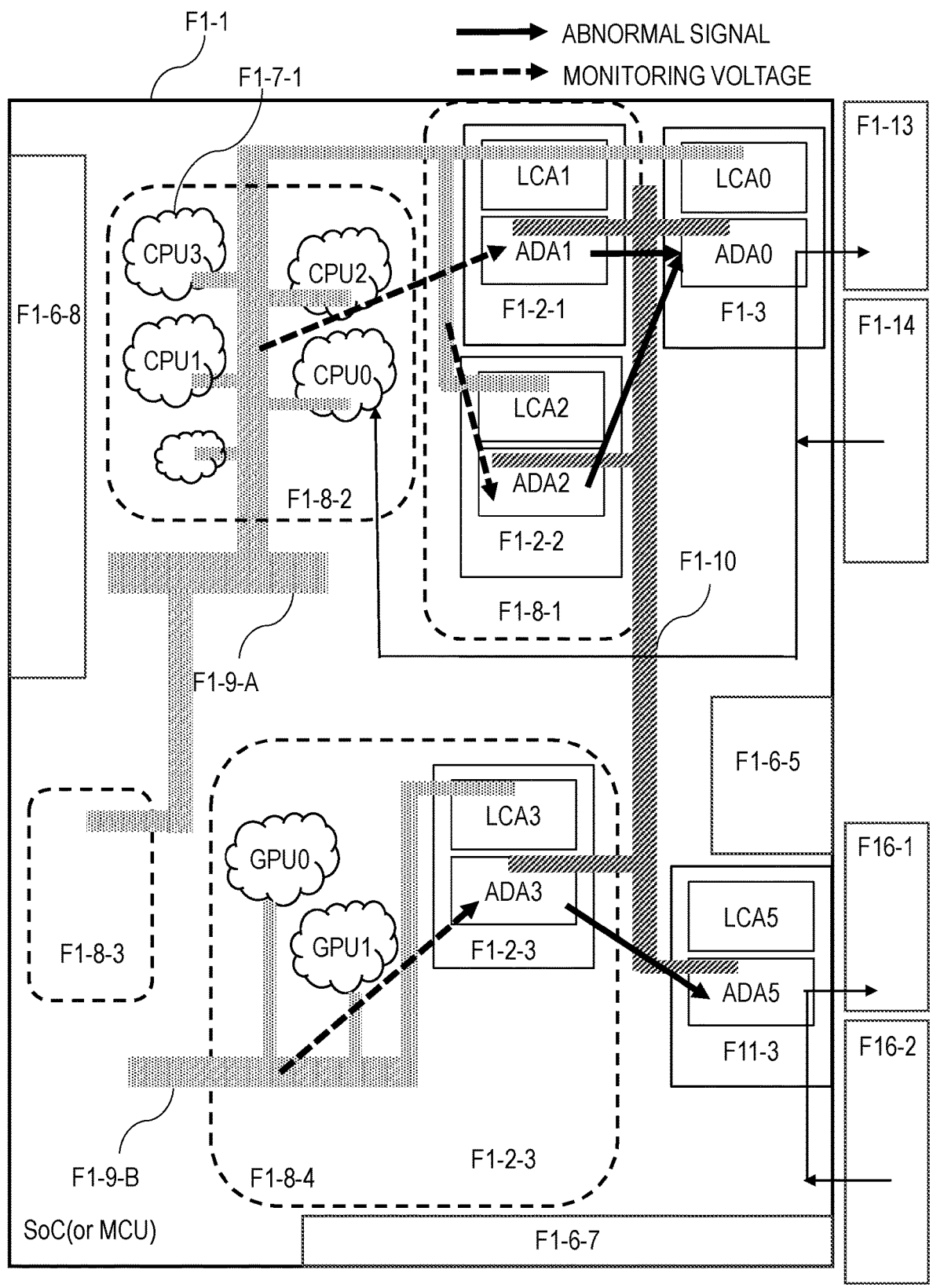
FIG. 11 is a block diagram of a SoC of the abnormal power supply voltage detection device according to the third embodiment.

FIG. 11 is a block diagram of a SoC of the abnormal power supply voltage detection module according to the third embodiment. In a third embodiment, a CIVFD output 2 (F11-3) and an external module (F16-1) and an external module (F16-2) with an ADC function connected thereto are added to the first embodiment. And the analog power supply line (F1-10) is extended to CIVFD output 2 (F11-3). Thus, the transmitting destinations of the signals of (F2-32) and (F2-33) are changed from CIVFD output to CIVFD output 2 (F11-3).

According to a third embodiment, as the core voltage power supply line A and the core voltage power supply line B, the power supply voltage is abnormal for each power supply system by grouping each power supply system of the same potential different power supply or different potential different power supply and providing multiple CIVFD outputs. It becomes possible to perform detection.

Fourth Embodiment

Figure 12:
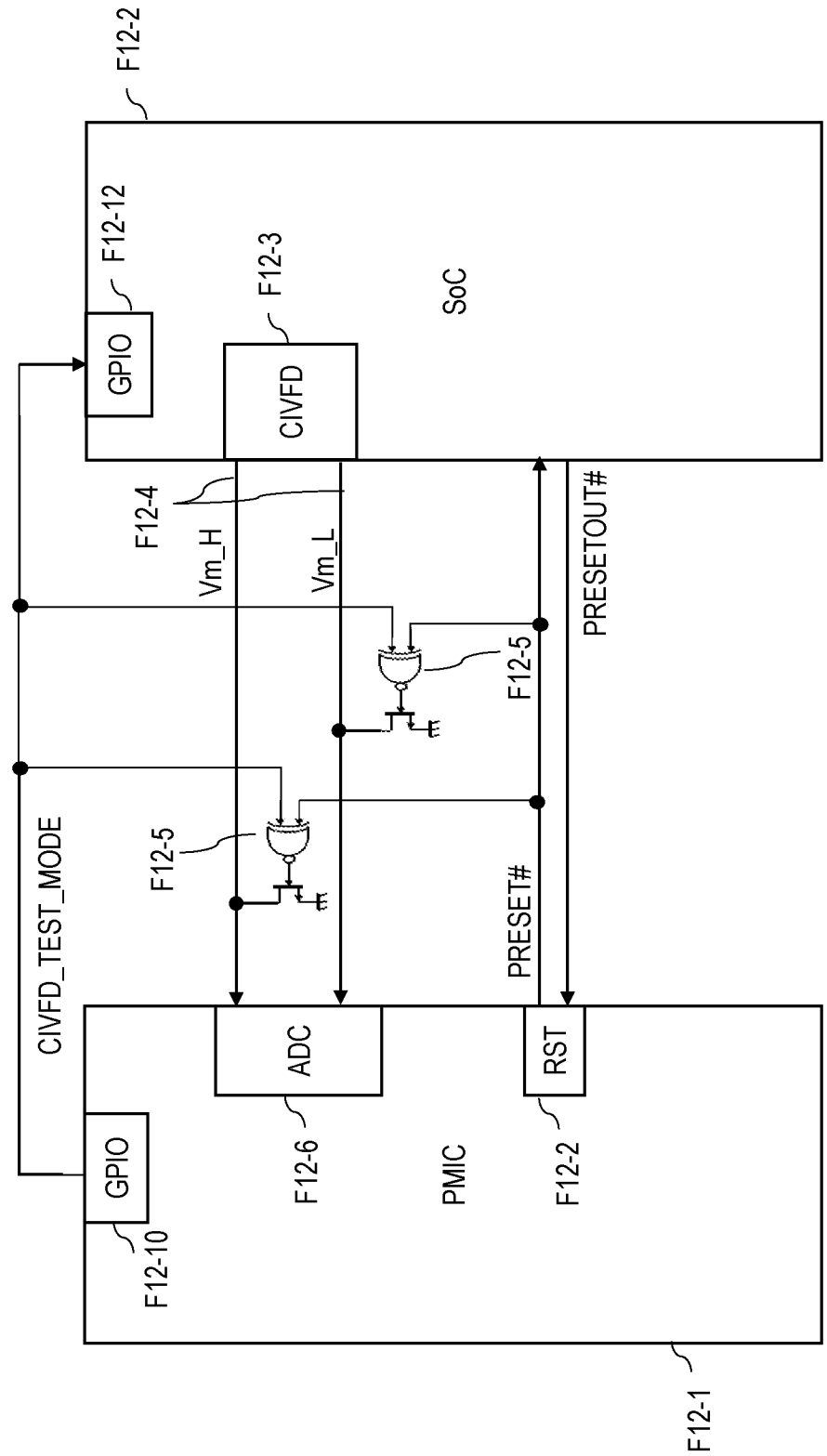
FIG. 12 is a configuration diagram of an external terminal connecting system example of CIVFD.

FIG. 12 is a block diagram showing an example of an external terminal connecting system configuration of CIVFD.

External terminal connection system has PMIC (Power Management Integrated Circuit)(F12-1), SoC (F12-2), CIVFD (F12-3), XNOR-NMOS circuit (F12-5), GPIO (General-Purpose Input/Output)(F12-10, 12), ADC (F12-6), RESET (F12-2).

(System Operation)

PMIC (F12-1) sends power supply and PRRESET # signal to SoC (F12-2). SoC (F12-2) start operation and transmit PRESETOUT # signals. GPIO (F12-10) in PMIC (F12-1) sends the CIVFD_TEST_MODE signals to GPIO (F12-12 and XNOR-NMOS circuits (F12-5) of SoC (F12-2)(test setting). By XNOR-NMOS circuits (F12-5), CIVFD (F12-3) is connected to GND. Test setting for CIVFD (F12-3) is performed. GPIO (F12-10) in PMIC (F12-1) sends the CIVFD_TEST_MODE signals to GPIO (F12-12) and XNOR-NMOS circuits (F12-5) (test setting is stopped). By XNOR-NMOS circuits (F12-5), CIVFD (F12-3) can transmit Vm_H and Vm_L (F12-4) to the ADC (F17-6). Test of CIVFD (F12-3) is executed by the test settings described above.

Whether all the tests of CIVFD (F12-3) have been executed is checked, and if not, process again from the test setting signal. If all tests have been executed, the CIVFD_TEST_MODE signals are sent from GPIO (F12-10) to GPIO (F12-12) and XNOR-NMOS circuits (F12-5) (test setting). By XNOR-NMOS circuits (F12-5), CIVFD (F12-3) is connected to GNDs. Thus, the normal operation setting of CIVFD (F12-3) is performed. GPIO (F12-10) sends the CIVFD_TEST_MODE signal to GPIO (F12-12) and XNOR-NMOS circuits (F12-5) (test setting stop signal). XNOR-NMOS circuitry (F12-5) allows CIVFD (F12-3) to transmit Vm_H and Vm_L (F12-4) to the ADC (F12-6).

CIVFD (F12-3) can use the cache memory as a storage area for starting programs, etc., when DRAM is not valid, such as at LSI startup in normal operation. Since the data can be retained even after DRAM is enabled, the processor can switch to the program corresponding to function safety without interruption from the start program.

Figure 13:
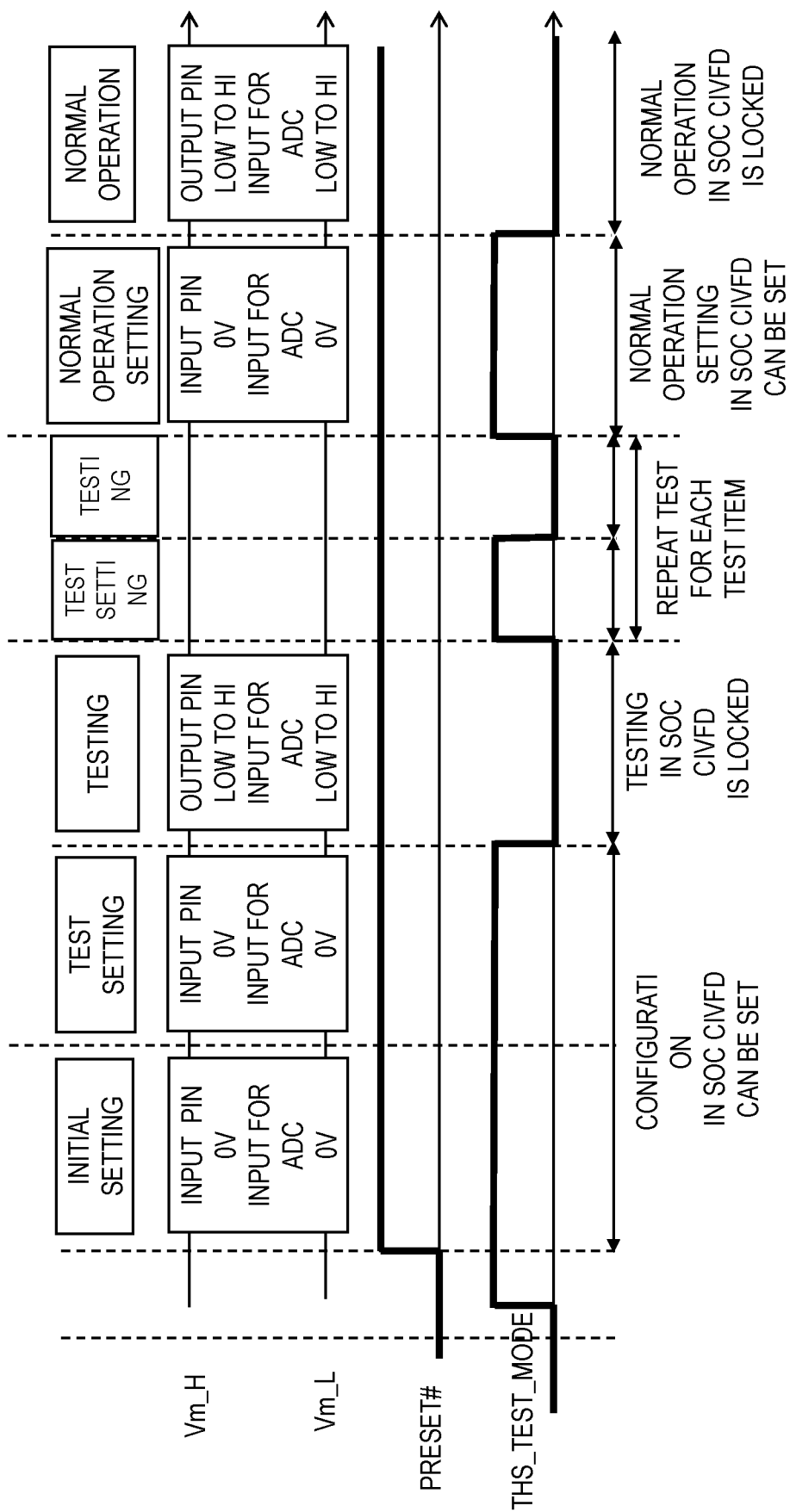
FIG. 13 is a diagram illustrating the transition of the signal and mode from the initial setting to the normal operation.

FIG. 13 is a diagram summarizing the transition of signals and modes from the above-described initial setting to normal operation.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. An abnormal power supply voltage detection device comprising:
   a plurality of core power supply areas connected by power supply voltage lines,
   wherein a first core power supply area of the plurality of core power supply areas includes an abnormal voltage output unit,
   wherein at least one core power supply area of the plurality of core power supply areas has an abnormal voltage detection unit, the at least one core power supply area is different from the first core power supply area, and wherein the abnormal voltage detection unit:
monitors whether a processing unit of a power supply separation area is power-off or not; and
when detecting that the processing unit is power-off, transmits an abnormal voltage detection signal to the abnormal voltage output unit through the power supply voltage lines.

2. The abnormal power supply voltage detection device according to claim 1,
wherein the abnormal voltage detection unit comprises a first logic control unit and a first analog voltage unit,
wherein the first logic control unit receives a temperature dependent shift condition setting signal, an under lower limit voltage condition setting signal, and an over upper limit voltage condition setting signal through a BUS, and
wherein the first logic control unit transmits data of the temperature dependent shift condition setting signal, the under lower limit voltage condition setting signal, and the over upper limit voltage condition setting signal to the first analog voltage unit.

3. The abnormal power supply voltage detection device according to claim 2, wherein the abnormal voltage detection unit has:
a first Unreliable Voltage Level Stabilization Control circuit (UVLSC) for inputting the temperature dependent shift condition setting signal and outputting a first UVLSC signal obtained by adding a signal transmission delay time to the temperature dependent shift condition setting signal;
a second UVLSC for inputting the under lower limit voltage condition setting signal and outputting a second UVLSC signal obtained by adding the signal transmission delay time to the under lower limit voltage condition setting signal; and
a third UVLSC for inputting the over upper limit voltage setting signal and outputting a third UVLSC signal obtained by adding the signal transmission delay time to the over upper limit voltage setting signal.

4. The abnormal power supply voltage detection device according to claim 3,
wherein the first analog voltage unit has:
a first latch for inputting the temperature dependent shift condition setting signal and the first UVLSC signal and outputting a first latch signal;
a second latch for inputting the second UVLSC signal and the under lower limit voltage condition setting signal and outputting a second latch signal;
a third latch for inputting the third UVLSC signal and the over upper limit voltage condition setting signal and outputting a third latch signal;
a first temperature dependent shifting unit for inputting the first latch signal and the second latch signal and outputting a first shift signal;
a second temperature dependent shifting unit for inputting the first latch signal and the third latch signal and outputting a second shift signal;
an under low limit voltage detection unit for inputting the first shift signal and the voltage and outputting a first detection signal; and
an over upper limit voltage detection unit for inputting the second shift signal and the voltage and outputting a second detection signal, and
wherein the first analog voltage unit transmits the first detection signal and the second detection signal to the abnormal voltage output unit.

5. The abnormal power supply voltage detection device according to claim 2, wherein the first analog voltage unit is arranged in an analog power supply area included in the at least one core power supply area.

6. The abnormal power supply voltage detection device according to claim 3, when detecting that the processing unit is power-off, the first detection signal indicates an abnormal voltage lower than lower limit.

7. The abnormal power supply voltage detection device according to claim 1,
wherein the abnormal voltage output unit comprises a second logic control unit and a second analog voltage unit, and
wherein the second logic control unit receives an abnormal voltage detection setting signal through a BUS and transmits data of the abnormal voltage detection setting signal to the second analog voltage unit.

8. The abnormal power supply voltage detection device according to claim 7, wherein the second analog voltage unit has:
a fourth UVLSC for inputting the abnormal voltage detection setting signal and outputting the fourth UVLSC signal by adding a signal transmission delay time to the abnormal voltage detection setting signal;
a fourth latch for inputting the abnormal setting signal and the fourth UVLSC signal and outputting a fourth latch signal;
a selector for selecting an output signal from a plurality of abnormal voltage detection units; and
an output buffer for outputting the output signal.

9. The abnormal power supply voltage detection device according to claim 7, wherein the second analog voltage unit is arranged in an analog power supply area included in the first core power supply area.

* * * * *